United States Patent
Mathew et al.

(10) Patent No.: US 6,831,310 B1
(45) Date of Patent: Dec. 14, 2004

(54) INTEGRATED CIRCUIT HAVING MULTIPLE MEMORY TYPES AND METHOD OF FORMATION

(75) Inventors: Leo Mathew, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/705,504

(22) Filed: Nov. 10, 2003

(51) Int. Cl.$^7$ .................. H01L 29/80; H01L 31/112
(52) U.S. Cl. .................. 257/270; 257/315; 257/316; 257/328
(58) Field of Search ................. 257/270, 315, 257/316, 328

(56) References Cited

U.S. PATENT DOCUMENTS

| | | |
|---|---|---|
| 4,859,623 A | 8/1989 | Busta |
| 5,689,127 A | 11/1997 | Chu et al. |
| 5,804,848 A | 9/1998 | Mukai |
| 6,011,725 A | 1/2000 | Eitan |
| 6,097,065 A | 8/2000 | Forbes et al. |
| 6,150,687 A | 11/2000 | Noble et al. |
| 6,300,182 B1 | 10/2001 | Yu |
| 6,330,184 B1 | 12/2001 | White et al. |
| 6,355,961 B1 | 3/2002 | Forbes |
| 6,372,559 B1 | 4/2002 | Crowder et al. |
| 6,396,108 B1 | 5/2002 | Krivokapic et al. |
| 6,413,802 B1 | 7/2002 | Hu et al. |
| 6,414,356 B1 | 7/2002 | Forbes et al. |
| 6,433,609 B1 | 8/2002 | Voldman |
| 6,458,662 B1 | 10/2002 | Yu |
| 6,472,258 B1 | 10/2002 | Adkisson et al. |
| 6,580,124 B1 * | 6/2003 | Cleeves et al. ............. 257/331 |
| 6,583,469 B1 | 6/2003 | Fried et al. |
| 2003/0113970 A1 | 6/2003 | Fried et al. |

FOREIGN PATENT DOCUMENTS

| | | |
|---|---|---|
| DE | 101 25 967 C1 | 5/2001 |
| WO | WO 00/21118 | 4/2000 |

OTHER PUBLICATIONS

Related Application 10/074,732 entitled "Method of Forming a Vertical Double Gate Semiconductor Device and Structure Thereof" filed Sep. 3, 2002 entitled.
Related Application 10/443,375 entitled "Transistor With Independent Gate Structures" filed May 22, 2003.
Related Application 10/443,908 "Memory with Charge Storage Locations" entitled filed May 22, 2003.
Related Application 10/427,141 entitled "Semiconductor Fabrication Process with Asymmetrical Conductive Spacers" filed Apr. 30, 2003.

(List continued on next page.)

*Primary Examiner*—David Nelms
*Assistant Examiner*—Tu-Tu Ho
(74) *Attorney, Agent, or Firm*—Robert I. King; David G. Dolezal

(57) ABSTRACT

A transistor (10) is formed having three separately controllable gates (44, 42, 18). The three gate regions may be electrically biased differently and the gate regions may have different conductivity properties. The dielectrics on the channel sidewall may be different than the dielectrics on the top of the channel. Electrical contacts to source, drain and the three gates is selectively made. By including charge storage layers, such as nanoclusters, adjacent the transistor channel and controlling the charge storage layers via the three gate regions, both volatile and non-volatile memory cells are realized using the same process to create a universal memory process. When implemented as a volatile cell, the height of the transistor and the characteristics of channel sidewall dielectrics control the memory retention characteristics. When implemented as a nonvolatile cell, the width of the transistor and the characteristics of the overlying channel dielectrics control the memory retention characteristics.

20 Claims, 7 Drawing Sheets

OTHER PUBLICATIONS

Lee et al.; "Multilevel Vertical–Channel SONOS Nonvolatile Memory on SOI", IEEE Electron Device Letters, 2002; pp 1–3 and 208–209.

Yu, Bin et al; FinFET Scaling to 10nm Gate Length:; IEEE IDEM 2002; pp 251–254; IEEE.

Choi, Yang–Kyu et al.; "Sub–20nm CMOS FinFET Technologies"; 2001 IEEE, 4 pp.

Kedzierski, Jakub et al.; "High–Performance Symmetric–Gate and CMOS–Compatible V1 Asymmetric–Gate FinFET Devi ces"; 2001; IEEE; 4 pp.

Hisamoto, Digh et al.; "FinFET—A Self–Aligned Double–Gate MOSFET Scalable to 20 nm"; IEEE Transactions on Electron Devices; vol. 47, No. 12, Dec. 2000, pp 2320–2325.

Tanaka, Tetsu et al; Ultrafast Operation of $V_{th}$–Adjusted $p+n+$ Double Gate SOI MOSFET's; IEEE Electron Device Letters, vol. 15, No. 10, Oct. 1994; pp. 386–388.

Chan et al.; "A True Single–Transistor Oxide–Nitride–Oxide EEPROM Device"; IEEE Electron Device Letters; Mar. 1987; pp 93–95; vol. EDL–8, No. 3.

Gonzalez, Fernando Sr. et al.; "A Dynamic Source–Drain Extension (DSDE) MOSFET Using a Separately Biased Conductive Spacer"; pp 645–648.

Kim, Keunwoo et al.; "Double–Gate CMOS Symmetrical—Versus Asymmetrical–Gate Devices", IEEE Transactions On Electron Devices, vol. 48, No. 2; Feb. 2001; pp 294–299.

Fossum, Jerry G. et al.; "Extraordinarily High Drive currents in Asymmetrical Double–Gate MOSFETS"; Superlattices and Microstructures, vol. 28, No. 5/6, 2000, 2000 Academic Press, pp 525–530.

Singer, Pete; "Dual Gate Control Provides Threshold Voltage Options"; Semiconductor International; Nov. 1, 2003; 2pp: URL http://www.reed–electronics.com/semiconductor/index.asp?layout=article&articleId=CA331000&text=motorola&rid=0&rme=0&cfd=1.

* cited by examiner

US 6,831,310 B1

INTEGRATED CIRCUIT HAVING MULTIPLE MEMORY TYPES AND METHOD OF FORMATION

CROSS REFERENCE TO RELATED APPLICATIONS

This application is related to the following copending U.S. patent applications:
(1) U.S. Ser. No. 10/074,732 entitled "Method of Forming A Vertical Double Gate Semiconductor Device and Structure Thereof" assigned to the assignee hereof;
(2) U.S. Ser. No. 10/443,375 entitled "Transistor With Independent Gate Structures" assigned to the assignee hereof; and
(3) U.S. Ser. No. 10/443,908 entitled "Memory With Charge Storage Locations" assigned to the assignee hereof;
(4) U.S. Ser. No. 10/427,141 entitled "Semiconductor Fabrication Process With Asymmetrical Conductive Spacers" assigned to the assignee hereof.

FIELD OF THE INVENTION

This invention relates to semiconductors, and more particularly to transistors for use in memories.

RELATED ART

As transistor geometries have dramatically been reduced to sub-micron dimensions, transistor structures have been forced to be altered due to the impact on the device physics that the smaller dimensions have created. In particular, the channel of a transistor has become extremely narrow. Due to the small length of the channel, the drain electrode of a transistor begins to negatively control the current conduction within the channel rather than the gate electrode being the controlling mechanism. This problem is well documented and is commonly referred to as a short channel effect. To reduce the problem of short channel effect, others have proposed a transistor structure wherein a gate electrode is positioned on opposite sides of the channel. While this approach dramatically reduces the short channel effect problem, the ability to mass manufacture such a structure is problematic because properly aligning the oppositely positioned gates is very difficult to implement for mass production. As an alternative, a transistor structure having a vertical silicon channel that is surrounded by the gate electrode has been proposed to reduce short channel effects. Such transistors are referred to by several different names including FINFETs and double-gated transistors. While some implementations of FINFET transistors have a single gate electrode, other implementations have used two electrically isolated gate electrodes for improved performance including control of the transistor's threshold voltage. In order to electrically isolate the two gate electrodes that are around the channel, a chemical mechanical polish (CMP) or polishing step has been used. Due to the narrow fin structure of these transistors, the polishing step tends to cause uneven polishing or "dishing" of the transistor device.

Reduced transistor structures have also brought about the ability to integrate both non-volatile (e.g. read-only-memory and Flash) and volatile (DRAM and SRAM) memory arrays for system on chip (SOC) applications. Typically different transistor structures implemented with differing processes are required to implement both non-volatile and volatile memory arrays. For example, a Flash memory transistor is implemented with a floating gate structure that is between a channel and a control gate. In contrast, a DRAM memory transistor is implemented with a planar transistor controlling a deep trench capacitor. The planar transistor uses a single plane channel that separates a source and a drain and that is controlled by an overlying gate. The requirement to implement both volatile and non-volatile memory arrays on a single integrated circuit therefore adds significant cost since differing processes and structures must be implemented. Additionally, due to the different transistor structures that are required, the operating characteristics of the transistors on a same integrated circuit may significantly differ.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
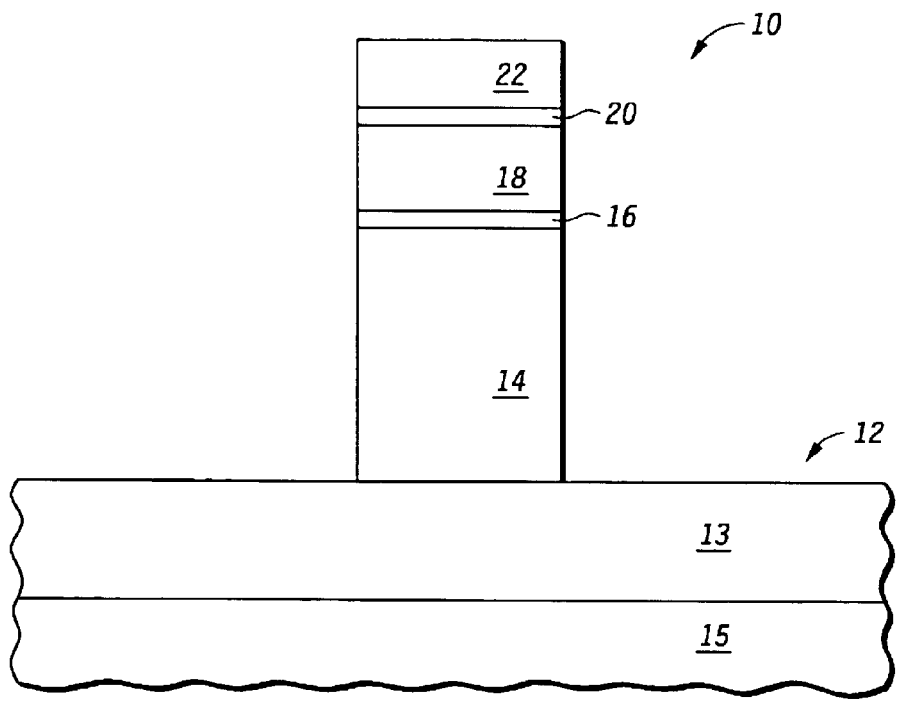
FIGS. 1–4 illustrate in cross-sectional form a field effect transistor in accordance with a first form of the present invention.

Illustrated in FIG. 1 is a cross-sectional view of a semiconductor wafer 12 during a stage in the manufacture of a field effect transistor 10 with three electrically isolated gate structures. Semiconductor wafer 12 includes a substrate 15 that is implemented with any of a variety of semiconductor materials, such as an SOI wafer, or with any mechanical substrate, such as a glass or sapphire substrate. Overlying the substrate 15 is an insulating layer 13. Insulating layer 13 may be implemented with any oxide or any nitride or sapphire. Overlying insulating layer 13 is a patterned fin semiconductor structure that forms a channel 14 of a FinFET (Fin Field Effect Transistor) that is silicon (either polysilicon, crystalline silicon, amorphous silicon, SiGe, germanium or a combination of any of these). Overlying the channel 14 is an oxide 16. Overlying the oxide 16 is a third gate 18 (the first and second gates to be identified below). In one form the third gate 18 is polysilicon. In another form, the third gate 18 may be a doped material using a conventional implant process. Overlying the third gate 18 is an oxide layer 20. In one form the oxide 20 is silicon dioxide. Overlying the oxide layer 20 is a nitride layer 22. In one form nitride layer 22 is silicon nitride. To form the illustrated structure of field effect transistor 10, each of channel 14, oxide 16, the third gate 18, oxide layer 20 and nitride layer 22 is formed by thermal growth of layers of the indicated material or deposition of the layers. The layers are conventionally patterned by etching the layers to create the structure of field effect transistor 10. Channel 14, oxide 16, the third gate 18 and nitride layer 22 have resulting exposed sidewalls.

Figure 2:
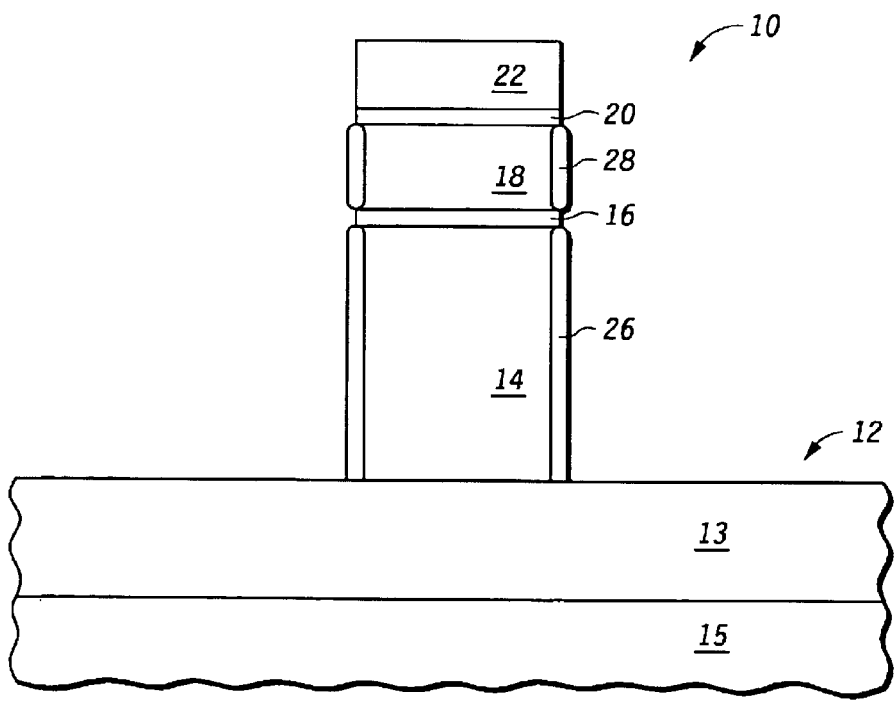

Illustrated in FIG. 2 is further processing of field effect transistor 10 of FIG. 1. A conventional sacrificial oxide clean step is performed after the etching. Channel 14 has sidewalls that are illustrated in cross-sectional form in FIG. 2 as being opposing. An oxide layer 26 is formed on the sidewalls of channel 14 (first and second sidewalls in FIG. 2 that are on opposite sides of channel 14), and an oxide layer 28 is formed on the sidewall of the third gate 18. It should be understood that oxide layer 26 is actually a continuous layer of material around channel 14 and thus different reference numbers are not assigned to the left side and the right side. The oxide layer 26 and the oxide layer 28 may be either thermally grown or deposited in a conventional manner, oxynitride or any high permittivity material such as, for example hafnium oxide, or a combination of these materials may be used as the material for each of oxide layer 26 and oxide layer 28.

Figure 3:
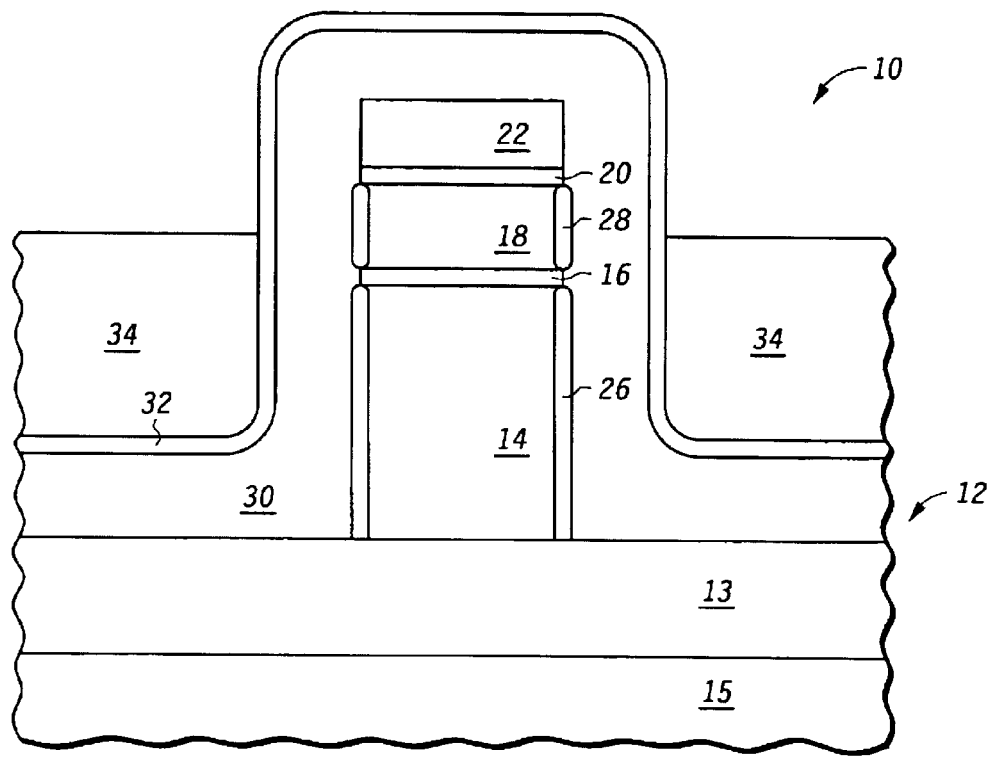

Illustrated in FIG. 3 is further processing of field effect transistor 10 of FIG. 2. A conformal polysilicon layer 30 is formed around the existing structure. In one form, polysilicon layer 30 is deposited. An optional implant of the polysilicon layer 30 may be implemented. The optional implanting may take one of several forms. The implanting may be multiple implants of same or different species (i.e. N-type and P-type), such as boron, phosphorous or arsenic, etc. The dose, direction and energy of the implanted species may be varied to define conductivity of regions within polysilicon layer 30 to the left and to the right of channel 14. If the doping type of polysilicon layer 30 is different than the doping of the first gate 18, this allows for the channel threshold voltage to be controlled as in an asymmetric double gate transistor. In other forms polysilicon layer 30 may be implemented with other materials such as silicon germanium, titanium nitride, tantalum silicon nitride or silicides or combinations of these. Overlying the polysilicon layer 30 is an antireflective coating (ARC) layer 32. In one form ARC layer 32 is a nitride. It should be understood that ARC layer 32 is an optional layer. The ARC layer 32 is conformal to the existing structure and is deposited. A spin-on resist layer 34 is deposited onto the field effect transistor 10 to a height which is initially greater than the height of the upper surface of nitride layer 22 and then etched back to expose a portion of the ARC layer 32. The etch may be either an isotropic or an anisotropic etch. The spin-on resist layer 34 exposes the nitride ARC layer 32 overlying the fin region of the FinFET and covers the other portions of the ARC layer 32. Other spin-on materials such as spin-on glass may be used for spin-on resist layer 34. Alternatively, the spin-on resist layer 34 may be formed at a desired height using conventional spin-on or deposition techniques.

Figure 4:
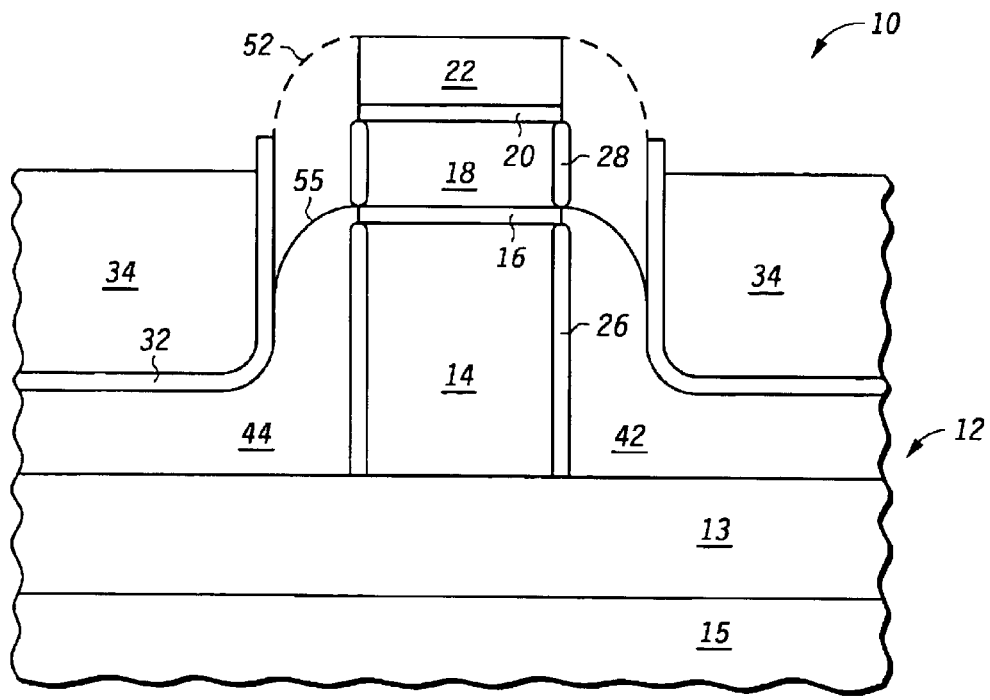

Illustrated in FIG. 4 is further processing of field effect transistor 10 of FIG. 3. In FIG. 4 field effect transistor 10 has been etched to remove an exposed portion of the ARC layer 32 and a portion of the polysilicon layer 30. The etching results in the formation of a first gate 44 and a second gate 42. This etch may stop at various points. In another form, a CMP polish step is used and the polishing results in the upper surface of first gate 44 being at edge 52. When an etch is performed, the upper surface of first gate 44 and second gate 42 may be positioned at various locations, such as at either edge 52 or further down such as at an edge 55. The location of the upper surface of first gate 44 and second gate 42 determines how much capacitive coupling exists between the third gate 18 and each of the first gate 44 and second gate 42. Therefore, in some applications it is generally more desirable to stop the etch when the upper surface of the first gate 44 and the second gate 42 is below the lower surface of the third gate 18. In other applications it is desirable to have some amount of capacitive coupling between the third gate and each of the first gate and second gate. Therefore, the etching provides a significant degree of flexibility in the control of the size of the first gate 44 and the second gate 42. The spin-on resist layer 34 and the nitride ARC layer 32 are removed using a conventional wet etch step. Additionally, nitride ARC layer 22 may be removed by the conventional wet etch step. Further, it should be noted that when suitable materials are used for spin-on resist layer 34, and nitride for ARC layer 32 and nitride layer 22 for making electrical contacts thereto, these layers may be kept in place rather than being etched away. For example, if spin-on resist layer 34 is implemented as a spin-on dielectric, and each of the first gate, the second gate and the third gate are suicides are metals, spin-on resist layer 34, ARC layer 32 and nitride layer 22 need not be etched away.

Figure 5:
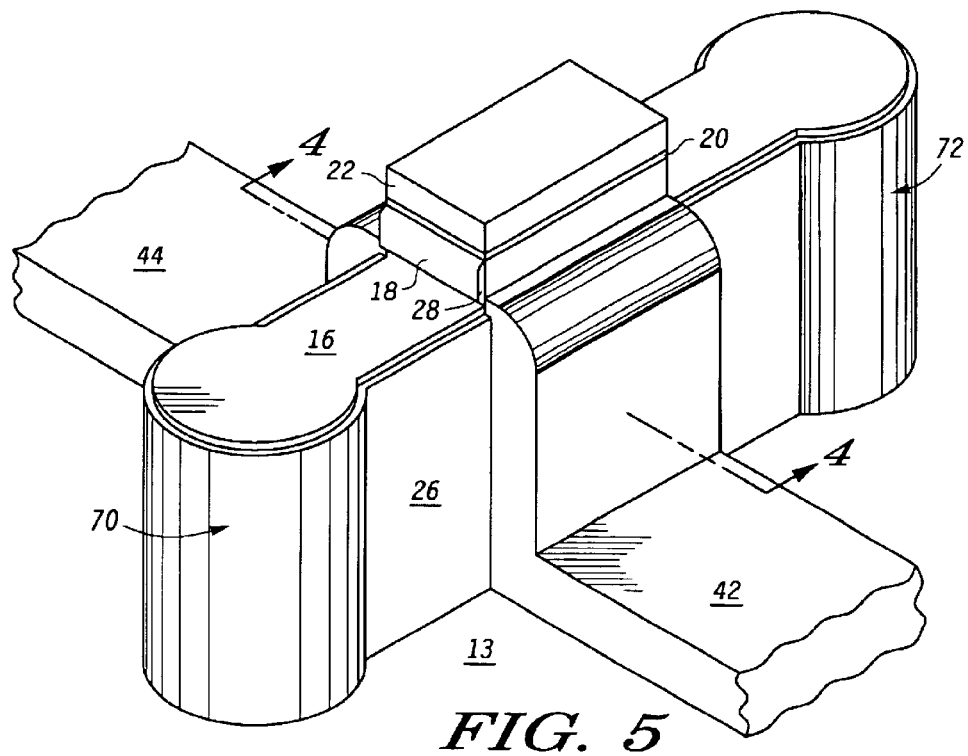
FIG. 5 illustrates in perspective form the field effect transistor of FIG. 4.

Illustrated in FIG. 5 is a perspective view of the field effect transistor 10 of FIG. 4. First gate 44, second gate 42, third gate 18, nitride layer 22 and oxide layer 20 have been lithographically patterned and etched using conventional photolithography. This patterning defines a gate length for each of first gate 44, second gate 42 and third gate 18 that is illustrated in FIG. 5. Using the photoresist as a mask, portions of the polysilicon layer 30, nitride layer 22, oxide layer 20 and third gate 18 are removed. Oxide layer 26 and gate oxide 16 function as an etch stop layer during the etching of this lithographic patterning. This processing exposes regions in which a source region 70 and a drain region 72 are formed by a conventional doping step such as an implant. Further additional processing may be implemented. For example, sidewall spacers (not shown) may be formed adjacent each of the first gate 44, the second gate 42 and the third gate 18. Also, silicidation of exposed silicon semiconductor surfaces may be implemented to reduce the resistivity of the silicon surfaces. If so, then this silicidation will form a silicidation layer at an upper surface of exposed portions of first gate 44, second gate 42, third gate 18, source region 70 and drain region 72. It should be noted that the order of process steps described herein may be varied. For example, the etching (or alternative polishing) to form the first gate 44 and the second gate 42 may be implemented after the formation of the spacers (not shown) or the silicidation described above.

Figure 6:
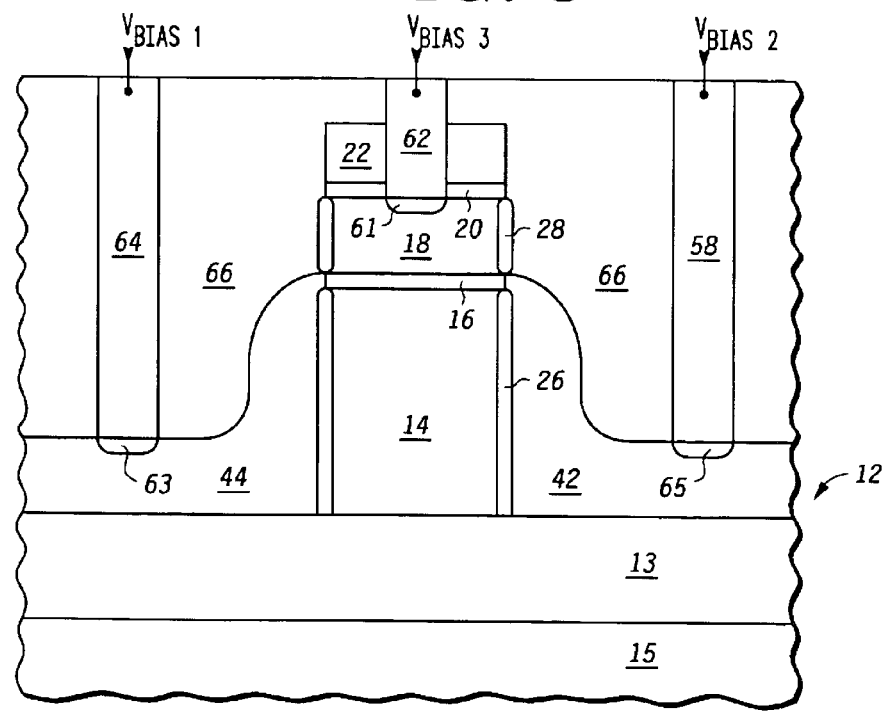
FIG. 6 illustrates in cross-sectional form the field effect transistor of FIG. 4 having electrical contacts.

Illustrated in FIG. 6 is further processing of field effect transistor 10 wherein an interlevel dielectric (ILD) 66 is formed by depositing a layer such as an oxide, a nitride, a low permittivity dielectric or a combination of these materials. Contact holes within the ILD 66 are lithographically defined and etched. The contact holes may be to all three of first gate 44, second gate 42 and third gate 18 or only to selected ones of these three gates. When the contact holes are formed, a metal contact 64 connects first gate 44 at a silicide region 63 created by the silicidation step described above. Similarly, a metal contact 58 connects the second gate 42 at a silicide region 65 and a metal contact 62 connects the third gate 18 at a silicide region 61. Any metal may be used for metal contacts 58, 62 and 64, such as tungsten or titanium nitride or others. Metal contact 64 is connected to a first bias voltage, $V_{BIAS\ 1}$. Metal contract 58 is connected to a second bias voltage, $V_{BIAS\ 2}$. Metal contact 62 is connected to a third bias voltage, $V_{BIAS\ 3}$. These three bias voltages may be the same voltage or may be different voltages or the same for only two of the bias voltages.

A transistor has been formed having three electrically isolate gate electrodes, first gate 44, second gate 42 and third gate 18. All three of these gates may independently control the channel 14. Each of the metal contacts 58, 62 and 64 may be separately biased with different voltage potentials to control characteristics such as threshold voltage, the "on" current and the "off" current. Additionally, the doping concentrations of each of these three electrically isolated gates may be varied by the doping concentrations chosen to implant into the first gate 44, second gate 42 and third gate 18. The doping concentration variation and type determines the threshold voltage characteristics of the field effect transistor 10.

Figure 7:
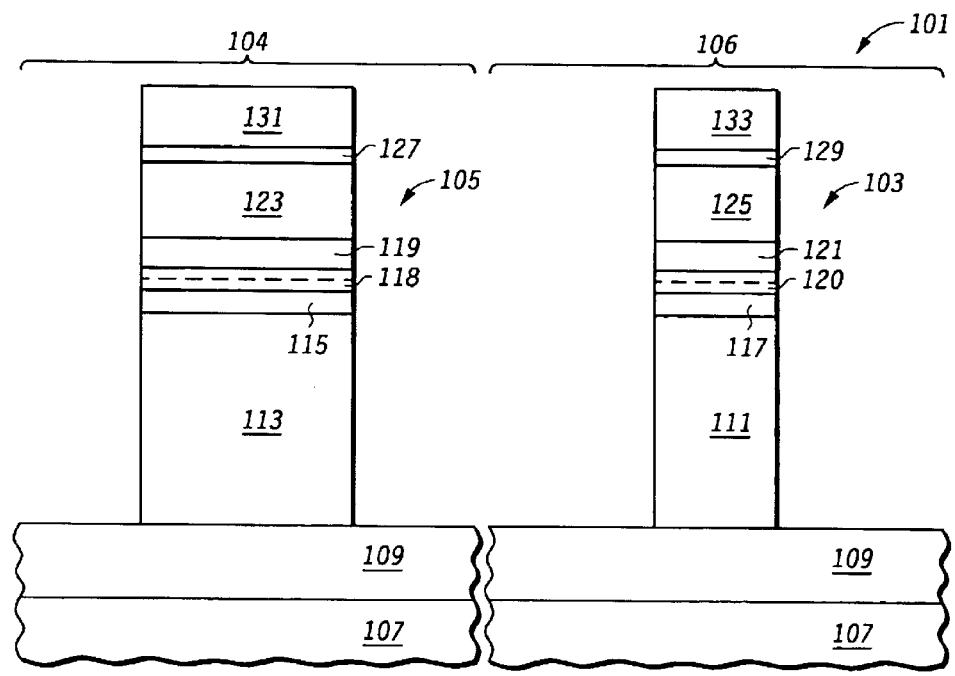
FIGS. 7–11 illustrates in cross-sectional form a memory application of a volatile memory transistor and a non-volatile memory transistor using a second form of the field effect transistor.

Illustrated in FIG. 7 is another form of field effect transistors having multiple electrically isolated gates that additionally have a memory storage capability. In particular, a nonvolatile region 104 and a volatile region 106 are provided on a wafer 101 and are respectively represented by a transistor 105 and a transistor 103. Photolithography and etch are used to define widths of transistors 105 and 103. Note that the width of the transistors in the nonvolatile region 104 is greater than the width of the transistors in the volatile region 106. Note also that the height of the transistor stacks forming transistors 105 and 103 are the same since they are formed from the same layers. In the illustrated form, nonvolatile region 104 and volatile region 106 are positioned in differing area of the wafer 101 as represented by the break between the two regions. A substrate 107 is provided with an overlying insulating layer 109. A channel 113 overlies the insulating layer 109. A charge storage structure is formed by an dielectric layer 115 overlying the channel 113, a charge storage layer 118 overlying the dielectric layer 115, and a control gate dielectric 119. In one form, each of dielectric layer 115 and control gate dielectric 119 is an oxide that is thermally grown. In another form the dielectric layer 115 is an oxynitride layer or a CVD-formed oxide. The charge storage layer 118 is formed by using a layer of nanoclusters. In one form the nanoclusters are implemented by silicon nanocrystals. In another form the nanoclusters are implemented by a layer of charge trapping nitride material. In yet another form, the nanoclusters are formed using a combination of these materials. Other charge storage materials may be used. Overlying the charge storage structure is a third gate 123 that is overlying the control gate dielectric 119. Overlying the control gate dielectric 119 is a pad oxide layer 127 and a nitride layer 131.

In the non-volatile region 106, a channel 111 overlies the insulating layer 109. A charge storage structure is formed by an dielectric layer 117 overlying the channel 111, a charge storage layer 120 overlying the dielectric layer 117, and a control gate dielectric 121. In one form, each of dielectric layer 117 and control gate dielectric 121 is an oxide that is thermally grown. In another form the dielectric layer 117 is an oxynitride layer or a CVD-formed oxide. The charge storage layer 120 is formed by using a layer of nanoclusters. In one form the nanoclusters are implemented by silicon nanocrystals. In another form the nanoclusters are implemented by a layer of charge trapping nitride material. In yet another form, the nanoclusters are formed using a combination of these materials. Other charge storage materials may be used. Overlying the charge storage structure is a third gate 125 that is overlying the control gate dielectric 121. Overlying the control gate dielectric 121 is a pad oxide layer 129 and a dielectric layer 133 that in one form is nitride.

Figure 8:
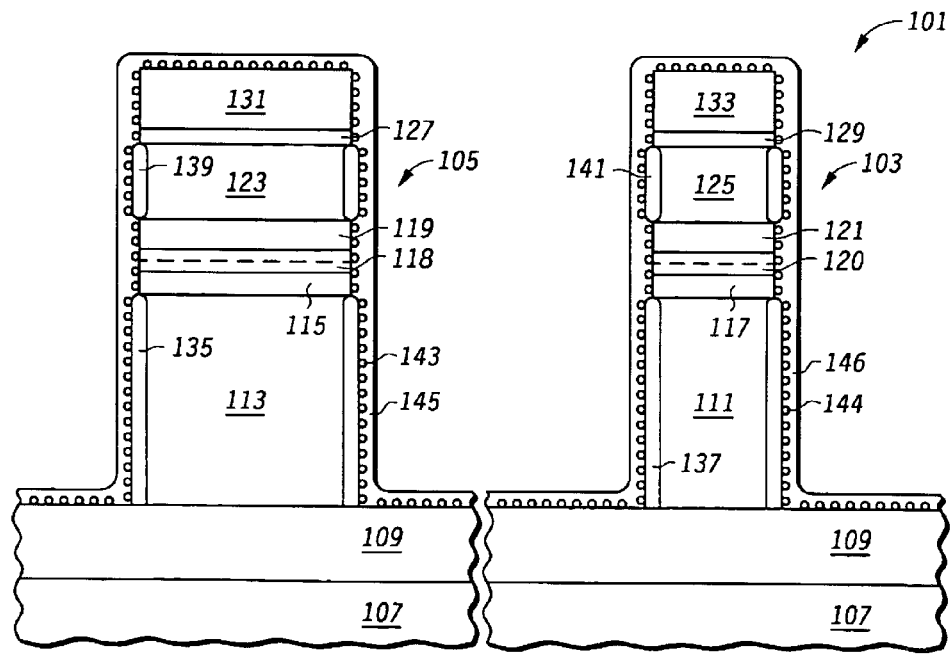

Illustrated in FIG. 8 is further processing of the field effect transistors of FIG. 7. A dielectric layer 135 and 139 is formed on sidewalls of channel 113 and third gate 123, respectively. Similarly, a dielectric layer 137 and a dielectric layer 141 is formed on sidewalls of channel 111 and first gate 125, respectively. A layer of nanoclusters 143 are formed over all exposed surfaces using conventional CVD methods. As mentioned above, the nanoclusters 143 may be any of a variety of different charge storage materials. Overlying the nanoclusters 143 is a dielectric layer 145. The dielectric layer 145 may be either deposited or grown and in one form is one of a nitride layer, an oxide layer or an oxynitride layer.

Figure 9:
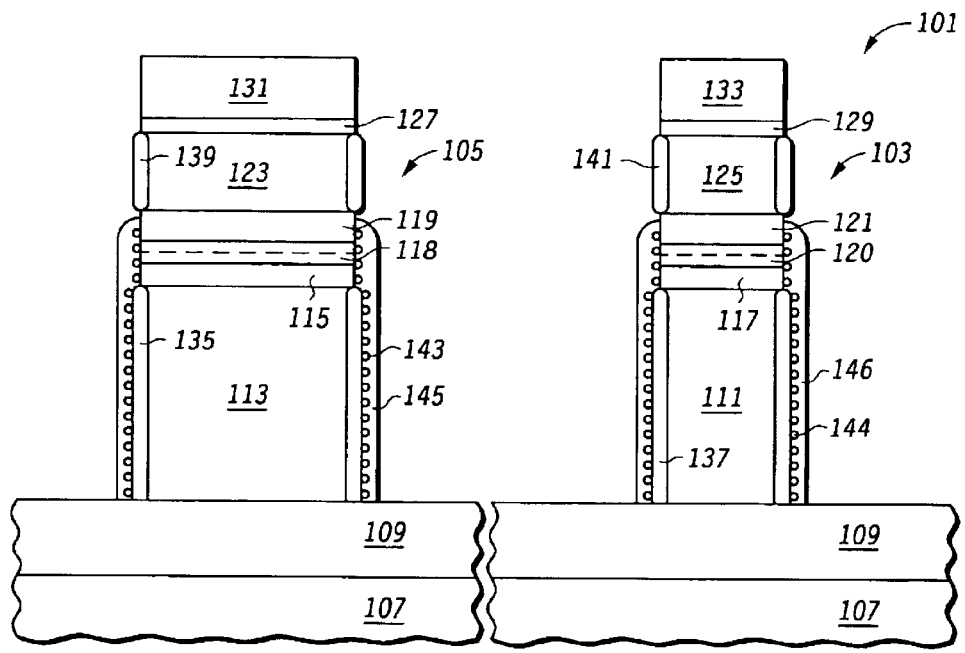

Illustrated in FIG. 9 is further processing of the field effect transistors of FIG. 7. An optional anisotropic etch is used to etch away regions of the nanoclusters 143 from exposed horizontal surfaces of the structure and partly in a vertical direction adjacent the edges of the transistor stacks. Although FIG. 9 illustrates that the nanoclusters 143 are etched along the sidewalls of the transistor stacks to a point below the third gates 123 and 125, the amount of nanoclusters that are etched from the sidewall may vary from any point along the sidewall of nitride layer 131 down to any point along the sidewall of channel 113. This etch creates separate dielectric layer 145 and dielectric layer 146 for transistors 105 and 103, respectively. Similarly, separate nanoclusters 143 and 144 are created for transistors 105 and 103, respectively. Additionally no etching of the nanoclusters 143 may occur and the processing of FIG. 9 is not implemented.

Figure 10:
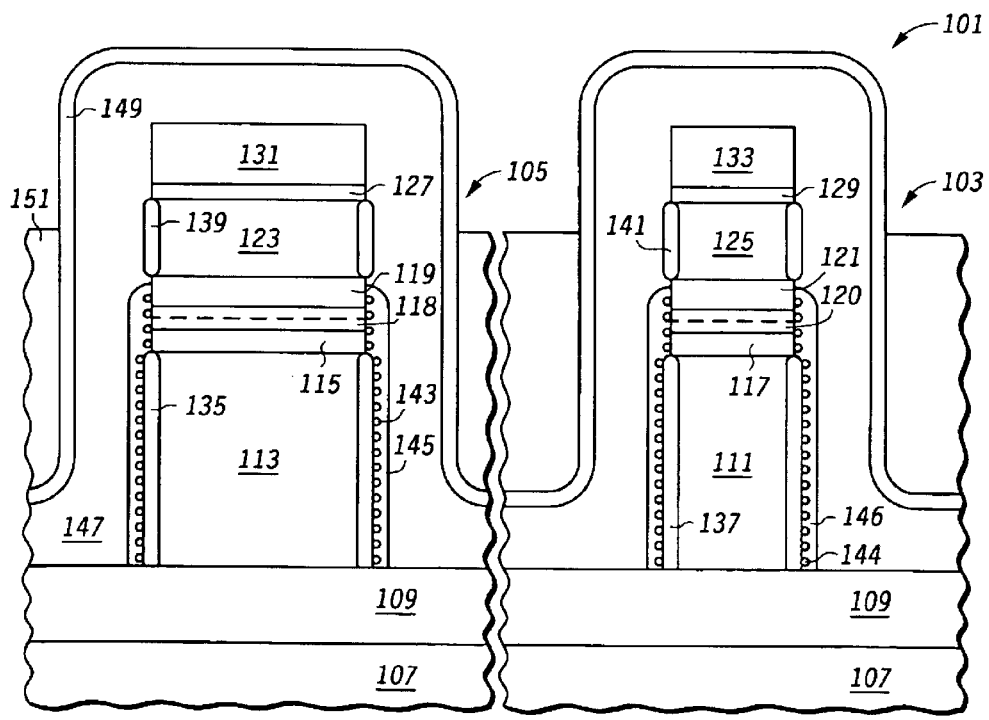

Illustrated in FIG. 10 is further processing of the transistors of FIG. 7. A conformal deposition of a gate layer 147 is made over transistor 105 and 103. The gate layer 147 may be polysilicon, silicon germanium, metal or a combination thereof. Overlying the gate layer 147 is a nitride layer 149. Other dielectrics may be used in lieu of nitride. The nitride layer 149 functions as an ARC layer. At this point, photolithography may be used to define predetermined regions of gate material on wafer 101 where the first gate, second gate and third gate will subsequently be positioned. At this point, in the regions where there is no gate patterning protecting the nitride layer 149, removal of nitride layer 149, gate layer 147, nitride layer 131, oxide layer 127, third gate 123 and the charge storage structure (control gate dielectric 119, charge storage layer 118 and dielectric layer 115) may be performed. A spin-on resist layer 151 is deposited onto the field effect transistors 105 and 103 to a height which is initially greater than the height of the upper surface of nitride layer 149 and then etched back to expose a portion of the nitride layer 149. The etch may be either an isotropic or an anisotropic etch. The spin-on resist layer 151 exposes the nitride layer 149 overlying the fin region of the FinFET and covers the other portions of the nitride layer 149. Other spin-on materials such as spin-on glass may be used for spin-on resist layer 151.

Figure 11:
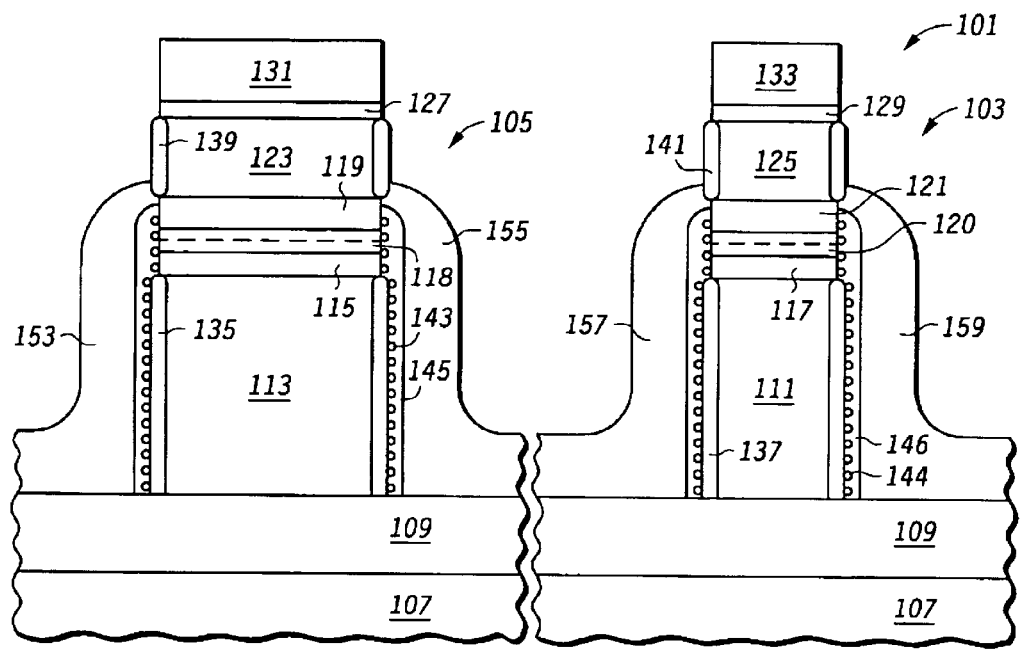

In FIG. 11, field effect transistors 105 and 103 are etched to remove an exposed portion of the nitride layer 149 and a portion of the gate layer 147. The etching results in the formation of a first gate 153 and a second gate 155 for transistor 105, and in the formation of a first gate 157 and a second gate 159 for transistor 103. Again, this etch step may stop at various points other than at the specific point illustrated in FIG. 11. The remainder of the spin-on resist layer 151 and nitride layer 149 is removed in a conventional manner. However, it should be noted that the spin-on resist layer 151, nitride layer 149 and nitride layer 131 may be left in place if suitable materials, such as spin-on glass, is used for the spin-on resist layer 151. In another form, the nitride layer 131 may be removed with the same step that removes nitride layer 149. Because transistor 105 of non-volatile region 104 has the same vertical dimensions as transistor 103 of volatile region 106, the profiles of transistor 105 and transistor 103 are the same except for the difference in width of the gates as previously mentioned.

Figure 12:
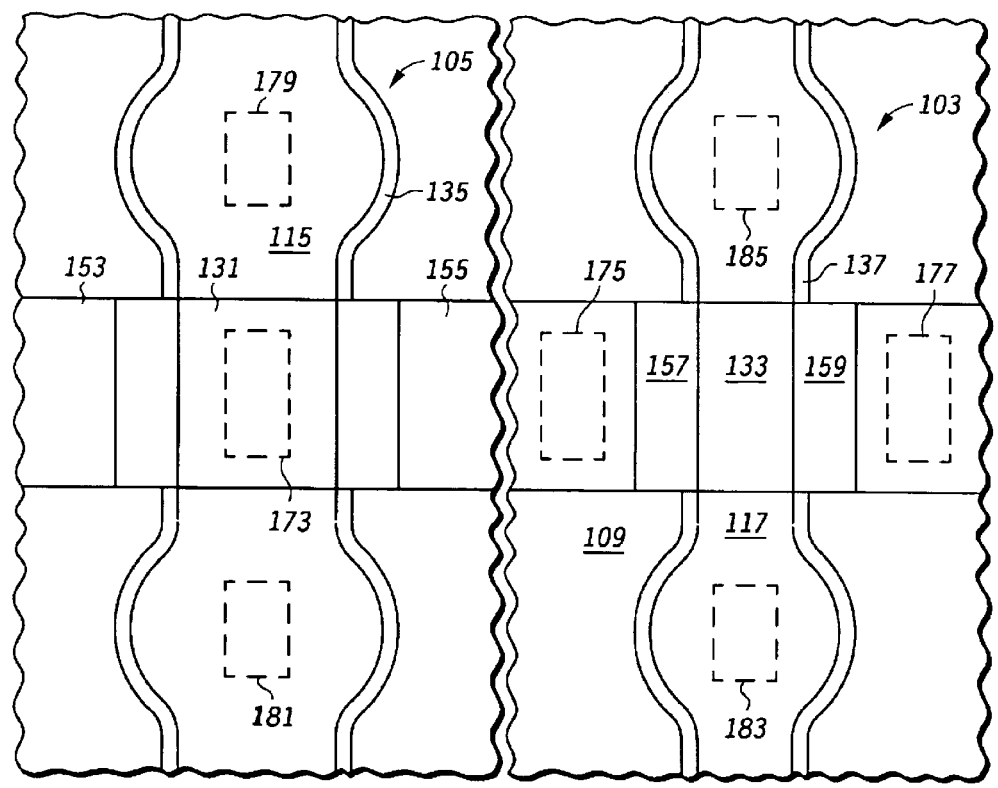
FIG. 12 illustrates in top plan form the volatile memory transistor and the non-volatile memory transistor of FIG. 11.

Illustrated in FIG. 12 is a top plan view of each of transistor 103 and transistor 105 in the present state represented in FIG. 11. A gate contact region 173 overlies the nitride layer 131 of transistor 105. Gate contact region 175 and gate contact region 177 respectively overlie first gate 157 and second gate 159 of transistor 103. Source contact region 179 overlies a source diffusion region of transistor 105, and drain contact region 181 overlies a drain diffusion region of transistor 105. Similarly, a source contact region 185 overlies a source diffusion region of transistor 103, and a drain contact region 183 overlies a drain diffusion region of transistor 103. As can be seen from the top view, the width of the channel of transistor 103 of volatile region 106 is typically less than the width of the channel of transistor 105 of nonvolatile region 104 but does not necessarily have to be less. The width of transistor 105 which forms a nonvolatile storage transistor is defined mainly by the amount of area needed to make an electrical contact to the third gate 123. The width of transistor 105 is also dependent upon the amount of charge storage area needed within charge storage layer 118 to make transistor 105 be non-volatile. In other words, the width of transistor 105 needs to be large enough to make charge storage layer 118 retain its charge when a bias voltage is removed from the third gate 123. In contrast, transistor 103 may have a narrower width because the storage characteristics are defined by the charge storage elements 144 in the sidewalls of the channel 111 rather than the width of charge storage layer 120. Additionally electrical contact to transistor 103 does not need to be made at the top third gate 125. Therefore, the height of transistor 103 and the electrical characteristics of dielectric layer 137 and dielectric layer 146 controls the memory retention characteristics of transistor 103, whereas the width of transistor 105 and the electrical characteristics of the control gate dielectric 119 and dielectric layer 115 control the memory retention characteristics of transistor 105. There could optionally be additional contacts (not shown) to each of the first gate 153, the second gate 155 and the third gate 123. Such contacts could be used to implement additional biasing of the channels 113 and 114, the layer of nanoclusters of charge storage layer 143 and the layer of nanoclusters of charge storage elements 144 or charge storage layer 118 and charge storage layer 120.

Figure 13:
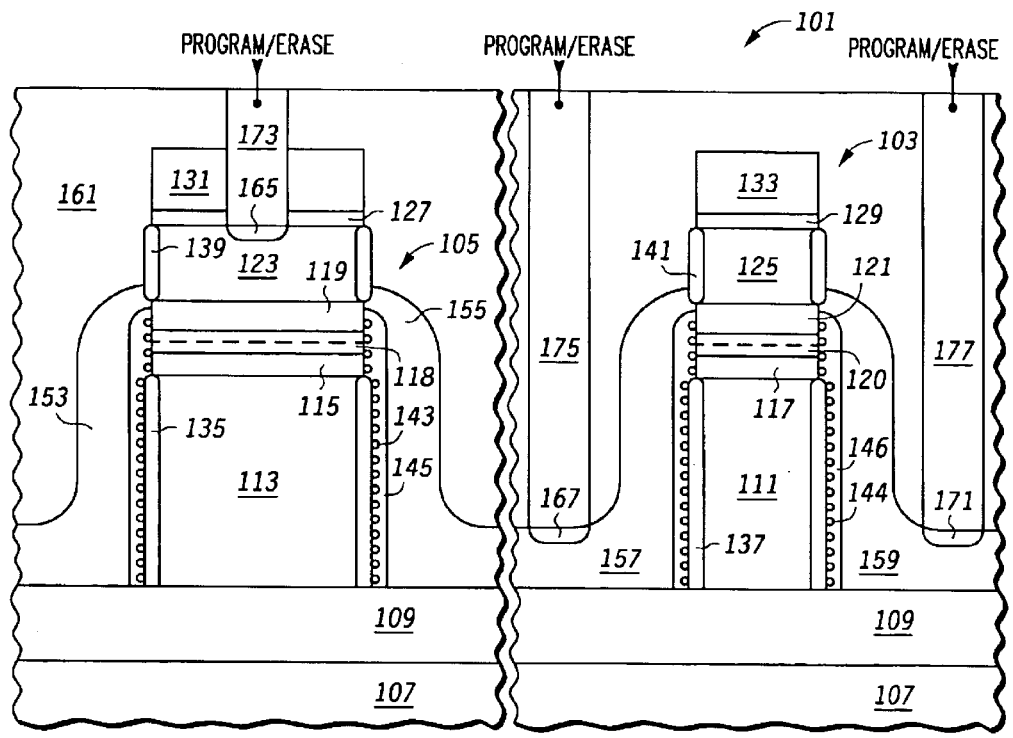
FIG. 13 illustrates in cross-sectional form the volatile memory transistor and the non-volatile memory transistor of FIG. 11 having electrical contacts.

Illustrated in FIG. 13 is a cross-sectional view of transistors 105 and 103 where silicided contact vias have been formed to predetermined gates of the transistors. A single gate contact is made to each transistor in the nonvolatile region 104. The gate that is contacted for each transistor in the nonvolatile region 104 is the overlying or top gate that overlies the channel. Two gate contacts are made to each transistor in the volatile region 106. The gates that are contacted for each transistor in the volatile region 106 are adjacent the sidewalls of the transistor. Where contact is made by contacts 173, 175 and 177, underlying silicide regions 165, 167 and 171 are respectively formed. By program (i.e. writing) biasing each transistor in the nonvolatile region 104 with a single voltage to the gate overlying the channel and making the channel wide enough to maintain the charge in the layer of nanoclusters 143, transistor 105 functions as a nonvolatile memory storage element. Similarly, when transistor 103 is biased at both of the gates that are adjacent the sidewalls of the channel 111, the layer of nanoclusters 144 of transistor 103 is charged and remains charged while power is refreshed or maintained at either first gate 157 or second gate 159.

Figure 14:
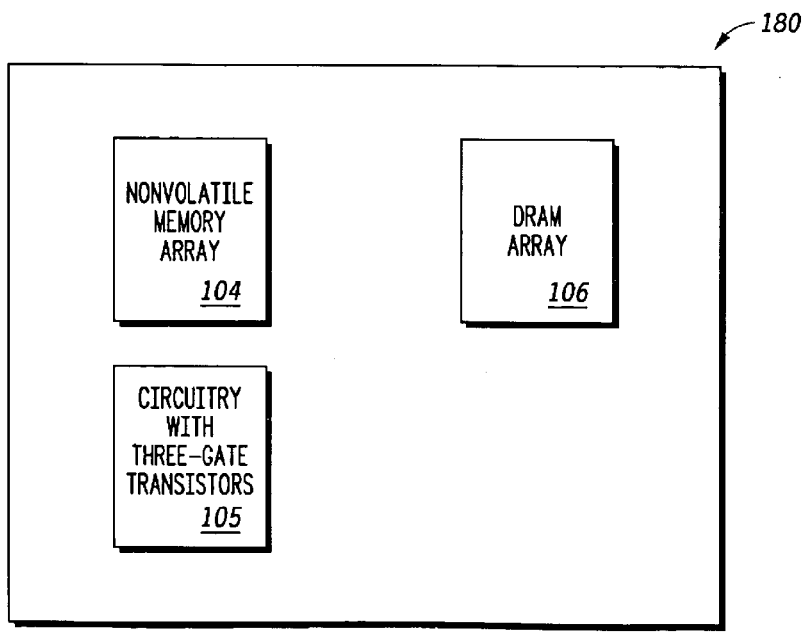
FIG. 14 illustrates a plan view of an integrated circuit implementing differing types of memory arrays by using the volatile memory transistor and the non-volatile memory transistor of FIG. 11.

Illustrated in FIG. 14 is an integrated circuit 180 having two differing types of memories that are implemented using the same processing to implement transistors like transistor 105 in a nonvolatile region 104, transistors like transistor 10 as embodied in FIGS. 1–6 in a region 105 having circuitry with three-gate transistors, and transistors like transistor 103 in a volatile region 106. While a dynamic memory such as a DRAM is identified as the type of storage device for the volatile region 106, other types of volatile memory arrays may be implemented such as a FLASH memory array. Any type of circuit, including logic, analog and digital circuits may be implemented in region 105 using the three-gate transistors. Any other of various circuit modules (not shown) may be included within integrated circuit 180 that use one or all three types (NVM three-gate transistors, volatile memory three-gate transistors and non-memory three-gate transistor structures) of transistor functions described herein. It should be apparent that an integrated circuit may be implemented that uses only one or two of the three circuit categories identified in FIG. 14.

By now it should be appreciated that there has been provided a transistor structure having three independent gates. In one form, this transistor can be configured to provide a universal memory architecture wherein both non-volatile and volatile memory cells may be implemented on a same integrated circuit using a same semiconductor process. The versatility of the transistor structure described herein significantly reduces the cost associated with manufacturing memories such as Flash or DRAM with ROM or SRAM on a same chip. Conventionally, different memory modules made using different processing steps are required to be implemented on the integrated circuit. By having three independent gates, the transistor functions to provide three distinct sources of channel electrical modulation. With the increased channel current control, the threshold voltage of the transistor can be more accurately controlled (i.e. the threshold voltage can be dynamically raised or lowered by varying the biasing of the combination of the gates). The transistor threshold voltage may also be set depending upon the size and type of gate dielectrics used to interface the channel with the three gates and depending upon the size and doping of the gates and the material composition of the gates. The third gate may be doped by conventional implantation or in-situ doping. The first and second gates may be implanted with angled implants of the same or differing species. The first and second gates may also be insitu doped to obtain the same conductivity.

By using one type of memory storage matter for charge storage layer 118 and a different type of memory storage matter for charge storage layer 143, different read and write memory mechanisms may be created. In particular, transistor 105 may be programmed (i.e. written) by using hot carrier injection (HCI) by using the overlying third gate and erased by tunneling or hot hole carriers by carrier conduction between the source and drain. Transistor 103 may be programmed by using tunneling or warm channel programming using the first gate 157 and the second gate 159. Transistor 103 may be erased by using tunneling from any of the three gates or by biasing the source drains appropriately.

In the foregoing specification, the invention has been described with reference to specific embodiments. However, one of ordinary skill in the art appreciates that various modifications and changes can be made without departing from the scope of the present invention as set forth in the claims below. For example, the channel 14 and third gate 18 that are below the nitride layer 22 may be recessed at the sidewall edges after the etch and clean steps described above. After forming charge storage layer 143 in FIG. 8, a portion of the wafer 101 may be masked and charge storage layer 143 and dielectric layer 145 may be removed from those areas of wafer 101 that are not masked. These regions may be used as transistors without storage locations on the perimeter (sides and top). Additionally, an etch of the third gate stack structure of transistor 103 may be implemented to remove charge storage layer 143, dielectric layer 145, dielectric layer 133, oxide layer 129, third gate 125, dielectric layer 141, control gate dielectric 121 and charge storage layer 120. The resulting structure is a transistor having a multiple sided channel. Also, the three gate regions may have different material properties wherein some gate regions are polysilicon and other gate regions are metallic.

In one form there has been provided an integrated circuit having multiple memory types. A first region of the integrated circuit has a plurality of transistors for implementing a non-volatile memory. The non-volatile memory has charge storing transistors, each of the charge storing transistors having three physically separate gate electrodes surrounding a channel and respective charge storage structures positioned around the channel and the three physically separate gate electrodes. A first gate electrode and a second gate electrode are positioned adjacent opposite sidewalls of the channel and a third gate electrode overlies the channel. The third gate electrode receives an electrical bias to program and erase its respective underlying charge storage structure. A second region of the integrated circuit has a plurality of transistors for implementing a volatile memory. The volatile memory has charge storing transistors, each of the charge storing transistors having three physically separate gate electrodes surrounding a channel. Respective charge storage structures are positioned around the channel and the three physically separate gate electrodes. A first gate electrode and a second gate electrode are positioned adjacent opposite sidewalls of the channel and a third gate electrode overlies the channel. Each of the first and second gate electrodes receives electrical bias to program and erase a respective one of the underlying charge storage structures. The channel for each of the plurality of transistors in the second region has a width that is different from channel widths for the plurality of transistors in the first region. In one form, the channel for each of the plurality of transistors in the second region has a width that is less than channel widths for the plurality of transistors in the first region. In another form a third region of the integrated circuit has a plurality of transistors, each of the plurality of transistors having three physically separate gate electrodes, wherein one, two or all of the three physically separate gate electrodes are biased. All of the three physically separate gate electrodes are biased with a same valued voltage potential. All of the three physically separate gate electrodes are biased with a different valued voltage potential. In another form an integrated circuit has a first memory and a second memory. The first memory includes a first semiconductor structure including a top surface, a first sidewall, and a second sidewall opposing the first sidewall. The first semiconductor structure is located in a first region of the integrated circuit. A first charge storage structure is located adjacent to the first sidewall. A first gate structure is located adjacent to the first charge storage structure on an opposite side of the first charge storage structure from the first sidewall. The second memory includes a second semiconductor structure having a top surface, a third sidewall, and a fourth sidewall opposing the third sidewall. The second semiconductor structure is located in a second region of the integrated circuit. A second charge storage structure is located over the top surface of the second semiconductor structure. A second gate structure is located over the second charge storage structure. The first memory and the second memory are formed at different locations of a same substrate with a same process. The second memory further includes a third charge storage structure located adjacent to the third sidewall. A third gate structure is located adjacent to the third charge storage structure on an opposite side of the third charge storage structure from the third sidewall. In one form a first contact is coupled to the first gate structure of the first memory, wherein no contact is coupled to the third gate structure of the second memory. The first memory further includes a third charge storage structure located over the top surface of the first semiconductor structure. A third gate structure is located over the third charge storage structure. In another form a first contact is coupled to the second gate structure of the second memory, wherein no contact is coupled to the third gate structure of the first memory. At least one of the first charge storage structure and the second charge storage structure includes nanoclusters. The nanoclusters are implemented by at least one of silicon nanocrystals, germanium nanocrystals, silicon-germanium alloy nanocrystals, gold nanocrystals, silver nanocrystals, and platinum nanocrystals. A third charge storage structure is located adjacent to the second sidewall. A third gate structure is located adjacent to the third charge storage structure on an opposite side of the third charge storage structure from the second sidewall. A method implements multiple memory types on an integrated circuit by providing a first region of the integrated circuit having a plurality of transistors for implementing a non-volatile memory. The non-volatile memory has a first plurality of charge storing transistors. Each of the first plurality of charge storing transistors is formed by providing a substrate and forming three physically separate gate electrodes overlying the substrate. The three physically separate gate electrodes surround a channel and at least one charge storage structure positioned around the channel and at least one of the three physically separate gate electrodes. A first gate electrode and a second gate electrode are positioned adjacent opposite sidewalls of the channel and a third gate electrode overlies the channel. Electrical contact is provided to the third gate electrode for receiving electrical bias for programming and erasing. A second region of the integrated circuit is provided having a plurality of transistors for implementing a volatile memory. The volatile memory has a second plurality of charge storing transistors. Each of the second plurality of charge storing transistors is formed by forming three physically separate gate electrodes overlying the substrate. The three physically separate gate electrodes surround a channel and at least one charge storage structure positioned around the channel and at least one of the three physically separate gate electrodes. A first gate electrode and a second gate electrode are positioned adjacent opposite sidewalls of the channel and a third gate electrode overlying the channel. Electrical contact is provided to each of the first and second gate electrodes for receiving electrical bias for programming and erasing. In another form, a third region of the integrated circuit having a third plurality of transistors is formed. The third plurality of transistors is formed by forming each transistor with three physically separate gate electrodes surrounding a channel region by only a gate dielectric material. Each of the three physically separate gate electrodes is biased with a same bias voltage. In another form only two of the three physically separate gate electrodes are biased with a same bias voltage. In another form each of the three physically separate gate electrodes is biased with three different bias voltages. In another form each channel of the plurality of transistors is formed in the first region with a width that is greater than each channel width of the plurality of transistors in the second region.

Accordingly, the specification and figures are to be regarded in an illustrative rather than a restrictive sense, and all such modifications are intended to be included within the scope of the present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit having multiple memory types comprising:
    a first region having a plurality of transistors for implementing a non-volatile memory, the non-volatile memory comprising charge storing transistors, each of the charge storing transistors having three physically separate gate electrodes surrounding a channel and respective charge storage structures positioned around the channel and the three physically separate gate electrodes, a first gate electrode and a second gate electrode positioned adjacent opposite sidewalls of the channel and a third gate electrode overlying the channel, the third gate electrode receiving electrical bias to program and erase its respective underlying charge storage structure; and
    a second region having a plurality of transistors for implementing a volatile memory, the volatile memory comprising charge storing transistors, each of the charge storing transistors having three physically separate gate electrodes surrounding a channel and respective charge storage structures positioned around the channel and the three physically separate gate electrodes, a first gate electrode and a second gate electrode positioned adjacent opposite sidewalls of the channel and a third gate electrode overlying the channel, each of the first and second gate electrodes receiving electrical bias to program and erase a respective one of the underlying charge storage structures.

2. The integrated circuit of claim 1 wherein the channel for each of the plurality of transistors in the second region has a width that is different from channel widths for the plurality of transistors in the first region.

3. The integrated circuit of claim 1 wherein the channel for each of the plurality of transistors in the second region has a width that is less than channel widths for the plurality of transistors in the first region.

4. The integrated circuit of claim 1 further comprising:
    a third region having a plurality of transistors, each of the plurality of transistors having three physically separate gate electrodes, wherein one, two or all of the three physically separate gate electrodes are biased.

5. The integrated circuit of claim 4 wherein all of the three physically separate gate electrodes are biased with a same valued voltage potential.

6. The integrated circuit of claim 4 wherein all of the three physically separate gate electrodes are biased with a different valued voltage potential.

7. An integrated circuit comprising:
    a first memory including:
        a first semiconductor structure including a top surface, a first sidewall, and a second sidewall opposing the first sidewall, the first semiconductor structure located in a first region of the integrated circuit;
        a first charge storage structure located adjacent to the first sidewall;
        a first gate structure located adjacent to the first charge storage structure on an opposite side of the first charge storage structure from the first sidewall;
    a second memory including:
        a second semiconductor structure including a top surface, a third sidewall, and a fourth sidewall opposing the third sidewall, the second semiconductor structure located in a second region of the integrated circuit;
        a second charge storage structure located over the top surface of the second semiconductor structure;
        a second gate structure located over the second charge storage structure, the first memory and the second memory being formed at different locations of a same substrate with a same process.

8. The integrated circuit of claim 7 wherein the second memory further comprises:
    a third charge storage structure located adjacent to the third sidewall; and
    a third gate structure located adjacent to the third charge storage structure on an opposite side of the third charge storage structure from the third sidewall.

9. The integrated circuit of claim 8 further comprising:
    a first contact coupled to the first gate structure of the first memory, wherein no contact is coupled to the third gate structure of the second memory.

10. The integrated circuit of claim 7 wherein the first memory further comprises:
    a third charge storage structure located over the top surface of the first semiconductor structure; and
    a third gate structure located over the third charge storage structure.

11. The integrated circuit of claim 10 further comprising:
    a first contact coupled to the second gate structure of the second memory, wherein no contact is coupled to the third gate structure of the first memory.

12. The integrated circuit of claim 7 wherein at least one of the first charge storage structure and the second charge storage structure includes nanoclusters.

13. The integrated circuit of claim 12 wherein the nanoclusters comprise at least one of silicon nanocrystals, germanium nanocrystals, silicon-germanium alloy nanocrystals, gold nanocrystals, silver nanocrystals, and platinum nanocrystals.

14. The integrated circuit of claim 7 further comprising:
    a third charge storage structure located adjacent to the second sidewall; and
    a third gate structure located adjacent to the third charge storage structure on an opposite side of the third charge storage structure from the second sidewall.

15. A method for implementing multiple memory types on an integrated circuit comprising:

providing a first region of the integrated circuit having a plurality of transistors for implementing a non-volatile memory, the non-volatile memory comprising a first plurality of charge storing transistors, each of the first plurality of charge storing transistors formed by the method of:

providing a substrate;

forming three physically separate gate electrodes overlying the substrate, the three physically separate gate electrodes surrounding a channel and at least one charge storage structure positioned around the channel and at least one of the three physically separate gate electrodes, a first gate electrode and a second gate electrode positioned adjacent opposite sidewalls of the channel and a third gate electrode overlying the channel;

providing electrical contact to the third gate electrode for receiving electrical bias for programming and erasing;

providing a second region of the integrated circuit having a plurality of transistors for implementing a volatile memory, the volatile memory comprising a second plurality of charge storing transistors, each of the second plurality of charge storing transistors formed by the method of:

forming three physically separate gate electrodes overlying the substrate, the three physically separate gate electrodes surrounding a channel and at least one charge storage structure positioned around the channel and at least one of the three physically separate gate electrodes, a first gate electrode and a second gate electrode positioned adjacent opposite sidewalls of the channel and a third gate electrode overlying the channel; and providing electrical contact to each of the first and second gate electrodes receiving electrical bias for programming and erasing.

16. The method of claim 15 further comprising:

forming a third region of the integrated circuit, the third region having a third plurality of transistors; and forming the third plurality of transistors by forming each transistor with three physically separate gate electrodes surrounding a channel region by only a gate dielectric material.

17. The method of claim 16 further comprising:

biasing each of the three physically separate gate electrodes with a same bias voltage.

18. The method of claim 17 further comprising:

biasing only two of the three physically separate gate electrodes with a same bias voltage.

19. The method of claim 17 further comprising:

biasing each of the three physically separate gate electrodes with three different bias voltages.

20. The method of claim 15 further comprising:

forming each channel of the plurality of transistors in the first region with a width that is greater than each channel width of the plurality of transistors in the second region.

* * * * *